(12) United States Patent
Kusunoki et al.

(10) Patent No.: US 7,520,930 B2
(45) Date of Patent: Apr. 21, 2009

(54) SILICON CARBIDE SINGLE CRYSTAL AND A METHOD FOR ITS PRODUCTION

(75) Inventors: Kazuhiko Kusunoki, Amagasaki (JP); Shinji Munetoh, Fukuoka (JP); Kazuhito Kamei, Hyogo (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 378 days.

(21) Appl. No.: 10/967,070

(22) Filed: Oct. 15, 2004

(65) Prior Publication Data

US 2005/0183657 A1 Aug. 25, 2005

Related U.S. Application Data

(63) Continuation of application No. PCT/JP03/04551, filed on Apr. 10, 2003.

(30) Foreign Application Priority Data

Apr. 15, 2002 (JP) .............................. 2002-112382

(51) Int. Cl.
*C30B 1/00* (2006.01)
*C30B 28/02* (2006.01)
*C30B 25/00* (2006.01)

(52) U.S. Cl. .................. 117/4; 117/7; 117/8; 117/9; 117/84; 117/88; 117/951

(58) Field of Classification Search .................. 117/40, 117/4, 7, 8, 9, 84, 88, 951; 423/345
See application file for complete search history.

(56) References Cited

U.S. PATENT DOCUMENTS 4,548,774 A * 10/1985 Akiyama et al. .............. 264/44

(Continued)

FOREIGN PATENT DOCUMENTS

EP 0 967 304 A1 5/1999

(Continued)

OTHER PUBLICATIONS

English Translation of Hitach JP 2000-264790 as cited by applicant on IDS.*

(Continued)

*Primary Examiner*—Michael Kornakov
*Assistant Examiner*—G. Nagesh Rao
(74) *Attorney, Agent, or Firm*—The Webb Law Firm

(57) ABSTRACT

A bulk silicon carbide single crystal of good crystalline quality which includes a minimized number of structural defects and is free from micropipe defects can be produced by crystal growth in a melt of an alloy comprising Si, C, and M (wherein M is either Mn or Ti) and having an atomic ratio between Si and M in which the value of x, when express as $Si_{1-x}M_x$, is $0.1 \leq x \leq 0.7$ in the case where M is Mn or $0.1 \leq x \leq 0.25$ in the case where M is Ti at a temperature of the melt which is below 2000° C. The C component is preferably supplied into the melt by dissolution of a graphite crucible which contains the melt such that the melt is free from undissolved C. One method of crystal growth is performed by cooling the melt after a seed substrate is immersed in the melt.

15 Claims, 2 Drawing Sheets

U.S. PATENT DOCUMENTS

| | | | |
|---|---|---|---|
| 5,499,601 A * | 3/1996 | Imai et al. | 117/84 |
| 6,436,186 B1 * | 8/2002 | Tanino et al. | 117/4 |
| 2005/0183657 A1 * | 8/2005 | Kusunoki et al. | 117/2 |
| 2006/0171873 A1 * | 8/2006 | Inoue | 423/345 |

FOREIGN PATENT DOCUMENTS

| | | |
|---|---|---|
| EP | 1130137 A | 9/2001 |
| JP | 58156597 A | 9/1983 |
| JP | 2000-264790 A | 9/2000 |
| JP | 2001-106600 | 4/2001 |
| WO | WO 01/18287 A1 | 3/2001 |

OTHER PUBLICATIONS

Hofmann, Müller, "Prospect of the use of liquid phase techniques for the growth of bulk silicon carbide crystals", Materials Science and Engineering, vol. 61-62, Jul. 1999, pp. 29-39.

* cited by examiner

SILICON CARBIDE SINGLE CRYSTAL AND A METHOD FOR ITS PRODUCTION

CROSS-REFERENCE TO RELATED APPLICATIONS

This application is a continuation of International Patent Application Number PCT/JP03/04551, filed Apr. 10, 2003, entitled "Silicon Carbide Single Crystal And Method For Preparation Thereof" and designating, inter alia, the United States, which claims priority to Japanese Patent Application Serial No. 2002-112382, filed Apr. 15, 2002, and which international application is herein incorporated by reference.

BACKGROUND OF THE INVENTION

1. Field of the Invention

The present invention relates to a method for producing a bulk single crystal of silicon carbide (SiC) of good crystalline quality which is suitable for use as a substrate material for optical devices and electronic devices, and more particulary to a method capable of stably producing such a silicon carbide single crystal at a temperature of 2000° C. or lower, which is preferred from the viewpoint of operation. The present invention also relates to a bulk silicon carbide single crystal of good crystalline quality which is thus prepared.

2. Description of Related Art

Silicon carbide (SiC) is a class of thermally and chemically stable compound semiconductors and is characterized by having a band gap of about three times, a dielectric breakdown voltage of about ten times, a rate of electron saturation of about two times, and a coefficient of thermal conductivity of about 3 times as large as that of silicon (Si). In view of these favorable properties, silicon carbide is expected to be useful in applications as a substrate material for power devices which surpass the physical limitations of Si devices and for environment-resisting devices which operate at high temperatures.

In optical devices, materials based on gallium nitride (GaN) are being developed for shortening the operating wavelength. Silicon carbide has a significantly smaller lattice mismatch with GaN compared to other compound semiconductors, so it attracts attention as a substrate material for use in epitaxial growth of a GaN layer.

It is well known that silicon carbide occurs in polytypes which differ from each other with respect to the stacking sequence of atomic layers (SiC biatom layers) in the c-axis direction. The most common polytypes are 3C, 6H, 4H, and 15R wherein the suffixes C, H, and R indicate the cubic, hexagonal, and rhombohedral structures, respectively, and the number preceding each suffix indicates the number of biatom layers stacked within each cycle of the crystals. Thus, 3C means a cubic crystal having a cycle in which three biatom layers are stacked; 4H and 6H mean hexagonal crystals having a cycle in which four and six biatom layers, respectively, are stacked; and 15R means a rhombohedral crystal having a cycle in which 15 biatom layers are stacked.

In order to apply silicon carbide to electronic or optical devices, a bulk silicon carbide single crystal of good crystalline quality having no or quite few defects is required. The below-mentioned physical vapor transport (PVT) technique (which is the technique commonly employed in the production of SiC single crystals) tends to result in incorporation of other crystal forms due to the occurrence of polytypical transformation during growth of an SiC single crystal. This leads to the occurrence of structural defects such as micropipes and stacking faults. Micropipes are defects in the form of hollow cores having a diameter of about 2 micrometers or greater, resulting from a large Burgers vector for dislocation in crystal, leaving the dislocation line as a hollow defect. Stacking faults are caused by disorder or disturbance in stacking sequence of layers due to dislocation in crystal. In particular, micropipes are fatal defects, and those portions of a single crystal including micropipe defects cannot be used for substrates.

The methods for the production of silicon carbide which are known in the prior art include a physical vapor transport (PVT) technique and a chemical vapor deposition (CVD) technique, both belonging to a vapor phase growth method, the Acheson method, and a solution growth technique which belongs to a liquid phase growth method (also called a liquid phase epitaxy [LPE] method).

The PVT technique comprises subliming a silicon carbide powder used as a raw material at a high temperature in the range of 2200-2500° C. and depositing silicon carbide on a seed (crystal) substrate of a silicon carbide single crystal which is placed in a region having a lower temperature. The CVD technique uses a silane gas and a hydrocarbon gas as raw materials for a vapor phase reaction, thereby causing epitaxial growth of a silicon carbide single crystal on a heated substrate of a material such as Si.

The Acheson method has been utilized for a long time in commercial production of silicon carbide crystals for use as an artificial abrasive. It is a method in which silicon carbide is prepared by loading anhydrous silicic acid and carbon around a carbon electrode and heating the loaded materials to a high temperature of 2500-2700° C. by passing electricity through the electrode. Single crystals of silicon carbide are produced as by-products.

The solution growth technique comprises melting Si or an Si-containing alloy in a graphite crucible, thereby causing carbon to dissolve from the crucible into the resulting melt to form a molten solution, and allowing a layer of silicon carbide single crystal to grow on a seed substrate placed in a lower temperature region of the solution by deposition from the liquid phase (molten silicon carbide solution). In a variation of the solution growth technique using an Si-containing alloy, a solution is prepared by dissolving C and Si in molten Cr, and a silicon carbide single crystal is allowed to grow from the molten solution in the same manner as above.

Silicon carbide single crystals grown by the PVT technique include many structural defects such as micropipe defects and stacking faults. In the PVT technique, SiC vapor is not present in the sublimated gas. Instead, Si, $Si_2C$, and $SiC_2$ vapors which are vaporized from a silicon carbide powder and C vapor which is vaporized from a graphite jig or tool coexist in the sublimated gas. The formation of many structural defects in the PVT technique is caused by the facts that it is quite difficult to control the partial pressures of these various vapors in a stoichiometric manner and that complicated reactions are involved in the crystal growth.

Nevertheless, bulk silicon carbide single crystals have mostly been produced by the PVT technique for the reason that it is extremely difficult for the other techniques to stably produce a bulk silicon carbide single crystal at a satisfactory growth rate, as described below. Because bulk silicon carbide single crystals produced by the PVT technique include many micropipe defects, it is difficult to produce from these crystals semiconductor devices of a square shape measuring a few millimeters with a good yield. Researches on the PVT technique with the aim of reducing the occurrence of micropipe defects has been done actively, but there have been no reports indicating that a micropipe-free bulk silicon carbide single crystal which contains substantially no micropipe defects has been obtained by the PVT technique.

The CVD technique is not suitable for the production of a bulk single crystal, which is required to manufacture a silicon carbide substrate, due to limited amounts of the raw materials being supplied in gaseous states. Therefore, the CVD technique is utilized solely for the growth of a silicon carbide crystal in the form of a thin film.

It is not possible for the Acheson method to produce a pure silicon carbide single crystal due to contamination of the raw materials with many impurities, and it is also not possible for that method to obtain a single crystal having a size sufficient for use as a substrate material.

In the solution growth technique, crystal growth proceeds in conditions close to thermal equilibrium, and thus a silicon carbide single crystal of good crystalline quality having an extremely low number of structural defects is obtained. However, since the concentration of carbon dissolved from a graphite crucible into a melt is low, the growth rate of a silicon carbide crystal is very slow. In the case of an Si solvent method in which the solvent material to be melted is Si, the growth rate of a silicon carbide crystal is said to be 5-12 μm/hr when the temperature of the melt is 1650° C. This growth rate is one or two orders of magnitude lower than that of the PVT technique. It is theoretically possible to increase the growth rate by elevating the temperature of the melt to 2000° C. or higher so as to increase the concentration of carbon which can be dissolved into the melt, but this results in severe evaporation of the Si solvent at atmospheric pressure, or if the melt is pressurized, the apparatus becomes complicated, either result being problematic for commercial production.

It has been attempted to add a transition metal or a rare earth metal such as Cr or Sc to a molten solvent of Si in order to increase the growth rate of a silicon carbide crystal by increasing the concentration of carbon dissolved in the molten solvent while suppressing the evaporation of the molten solvent. However, even if such a technique is employed, a product which has been actually obtained by the Si solvent method is merely a thin film having a thickness on the order of a few micrometers. Accordingly, like the CVD technique, the solution growth technique has been considered to be a technique suitable for forming a thin film on a seed substrate but unsuitable for the growth of a bulk single crystal.

JP-A 2000-264790 discloses that a raw material comprising at least one transition metal, Si, and C is heated to melt in a carbonaceous crucible (which is actually a graphite crucible) to form a molten solution, and a bulk silicon carbide single crystal is deposited and grown on a seed substrate by cooling the molten solution or forming a temperature gradient in the molten solution. It is described therein with respect to a system of 31Mo-66Si-3C, 54Cr-23Si-23C, or 29Co-65Si-6C, for example, that the growth rate at a temperature of 1750-2150° C. was 200-800 μm/hr on the average, although it depended on the temperature gradient in the molten solution.

In that method, however, carbon is not supplied by dissolution from the graphite crucible. Instead, the crucible is charged with a raw material containing a predetermined amount of carbon. Therefore, competitive dissolution of carbon from the crucible and from the raw material occurs inevitably. As a result, part of the carbon present in the raw material may remain undissolved in the molten solution, and the undissolved carbon may act as nuclei on which silicon carbide precipitates, thereby interfering with crystal growth on a seed substrate immersed in the molten solution and making it easy for subsequently growing silicon carbide crystals to become polycrystalline. The present inventors ascertained that a growth rate of only at most 100 μm/hr could be obtained at a temperature of 2000° C. or below.

SUMMARY Of The INVENTION

It is an object of the present invention to provide a method of stably producing a bulk silicon carbide single crystal of good crystalline quality having minimized structural defects at a practical growth temperature and growth rate. A specific object is to stably produce a bulk silicon carbide single crystal of good crystalline quality which is substantially free from micropipe defects at a practical growth rate by the solution growth technique at a temperature of 2000° C. or below, which is desirable from the standpoint of commercial operation.

The present invention provides a method of producing a silicon carbide single crystal characterized by comprising the steps of: immersing a seed substrate of silicon carbide in a melt of an alloy comprising Si, C, and M (wherein M is either Mn or Ti) and having an atomic ratio between Si and M in which the value of x, when expressed as $Si_{1-x}M_x$, is $0.1 \leq x \leq 0.7$ in the case where M is Mn or $0.1 \leq x \leq 0.25$ in the case where M is Ti, the melt being free from undissolved C; and allowing a silicon carbide single crystal to grow on the seed substrate by supercooling of the alloy melt as a molten solution at least in the vicinity of the seed substrate so as to create a state which is supersaturated with SiC.

The supercooling of the alloy melt at least in the vicinity of the seed substrate can be achieved (1) by cooling the alloy melt or (2) by establishing a temperature gradient in the alloy melt. Hereinafter, method (1) is referred to as a cooling method and method (2) as a temperature gradient method.

In the case of the cooling method, the temperature of the alloy melt when the substrate is immersed therein is preferably at least 1650° C. and at most 2000° C. and more preferably in the range of 1650-1850° C. The cooling rate is preferably 1-6 ° C./min. It is possible to continue the growth of the silicon carbide single crystal on the substrate so as to produce a silicon carbide crystal having an increased size by terminating the cooling of the alloy melt at a temperature which is higher than the solidus temperature of the alloy and subsequently performing supercooling repeatedly by repeating the heating and cooling of the melt alternatingly.

In the temperature gradient method, the temperature gradient is preferably in the range of 5-100° C./cm, and the temperature of the alloy melt in the vicinity of the substrate (hereinafter referred to as the temperature of growth interface) is preferably at least 1450° C. and at most 2000° C. and more preferably in the range of 1650-1850° C.

In either method, the carbon in the alloy melt is preferably supplied by dissolution of a carbonaceous crucible which contains the alloy melt.

According to the present invention, it becomes possible to produce a substantially micropipe-free bulk silicon carbide single crystal, and preferably a bulk silicon carbide single crystal which does not include micropipe defects as indicated by the fact that no micropipes having a diameter of about at least 2 micrometers are observed by inspection of a sample, which has been etched with molten KOH, under an optical microscope. Such a bulk single crystal has not been able to be produced in the prior art.

The term "bulk silicon carbide single crystal" used herein indicates a silicon carbide single crystal having a thickness of at least 50 micrometers. From the viewpoint of mechanical strength, the thickness of a bulk silicon carbide single crystal is preferably at least 200 micrometers, which makes it easy to handle a single crystal as a substrate material, and more preferably at least 500 micrometers, and most preferably at least 1500 micrometers.

DESCRIPTION OF THE PREFERRED EMBODIMENTS

Figure 1:
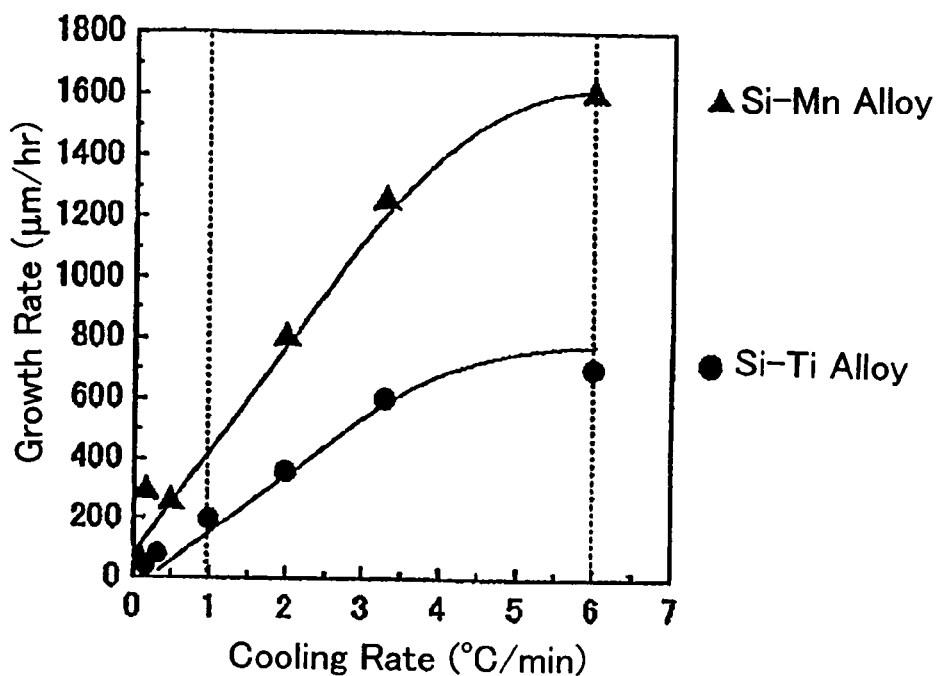
FIG. 1 is a graph showing the relationship between the cooling rate and the growth rate when a silicon carbide single crystal is grown on a seed substrate in a melt of $Si_{0.8}Ti_{0.2}$ or $Si_{0.4}Mn_{0.6}$ in a graphite crucible by cooling following isothermal heating at 1850° C. for $Si_{0.8}Ti_{0.2}$ or at 1650° C. for $Si_{0.4}Mn_{0.6}$ until the melt is saturated with carbon dissolved from the crucible.

The present inventors investigated the behavior of formation of a silicon carbide single crystal from a melt of an Si-C-M ternary alloy by repeated experiments and by calculations of ternary phase diagrams in order to study with respect to various conditions including the type and atomic ratio of desirable additional element M, growth rate of an SiC crystal, and thermal history of the melt.

As a result, it was found that a bulk silicon carbide single crystal can be stably produced at a melt temperature of 2000° C. or below and at a practically satisfactory growth rate without an increase in the occurrence of polymorphismic transformation or structural defects when M is Mn or Ti with an atomic ratio between Si and M in which the value of x in the formula $Si_{1-x}M_x$ is $0.1 \leq x \leq 0.7$ in the case where M is Mn or $0.1 \leq x \leq 0.25$ in the case where M is Ti.

In the experiments, a graphite crucible was charged with Si and an additional element M selected from various metals and heated at 1700° C. for one hour at atmospheric pressure in Ar in an isothermal furnace, thereby causing carbon to dissolve from the crucible into the resulting melt and forming a melt of an Si-C-M ternary alloy (a molten SiC solution) in the crucible. Thereafter, the graphite crucible was cooled to 1500° C. at a cooling rate of 1° C./min and then allowed to cool from 1500° C. to room temperature. The resulting solidified mass was etched with an HF—HNO₃ mixed acid (1:1), and the remaining silicon carbide crystals, which were formed by spontaneous precipitation, were obtained. From the size of the obtained silicon carbide crystals, the effectiveness of the additional element M on the growth rate of a silicon carbide single crystal was evaluated. For comparison, the same experiment was performed using a melt or molten solution formed in a crucible which was charged with Si alone with no additional element M.

As a result, compared to the size of crystals (several tens of micrometers) which were precipitated from the molten solution formed in the crucible charged with Si alone, much bigger crystals (with a size of 2 mm or larger) were obtained when the additional element was Mn or Ti. It was found that these crystals did not include micropipe defects by optical microscopic observation after etching with molten KOH and that they included very few structural defects by observation with a TEM (transmission electron microscope).

When a bulk silicon carbide single crystal was grown on a seed substrate of a silicon carbide single crystal using a molten solution formed in a graphite crucible which was charged with an Si—Mn or Si—Ti alloy as a solvent, it was confirmed that a sufficient solubility of carbon was ensured to crystallize a silicon carbide crystal as the primary crystal and produce a micropipe-free bulk single crystal of good crystalline quality at a growth rate of several hundred micrometers per hour, provided that the atomic ratio between Si and M (M being Mn or Ti and the atomic ratio being the value of x in the formula $Si_{1-x}M_x$) meets the above-described conditions.

In the case where the additional element M is Mn, if the atomic ratio x of Mn as expressed by the formula $Si_{1-x}Mn_x$ is less than 0.1, the carbon solubility becomes low, and the growth rate of a silicon carbide single crystal is decreased. On the other hand, if the value of x is greater than 0.7, the carbon solubility becomes too high, and there is an increased possibility of crystal growth of silicon carbide being retarded by precipitation of carbon crystals (graphite) on the seed substrate. The atomic ratio x of Mn is preferably in the range of 0.35-0.65. At a value of at least 0.35 for x, the effect of accelerating the growth rate of silicon carbide due to an increased amount of dissolved carbon appears significantly. At a value of at most 0.65 for x, the possibility of crystal growth of silicon carbide being retarded by precipitation of carbon crystals becomes low over a wide temperature range of the molten solution. A more preferred value of the atomic ratio x of Mn is in the range of 0.45-0.65.

In the case where the additional element M is Ti, if the atomic ratio x of Ti as expressed by the formula $Si_{1-x}Ti_x$ is less than 0.1, the carbon solubility becomes low, and the growth rate of a silicon carbide single crystal is decreased. If the value of x is greater than 0.25, a Ti-containing layer is readily formed on the seed substrate, and thus there is an increased possibility of the crystal growth of a silicon carbide layer being retarded. The Ti-containing layer is thought to be composed of titanium carbide (TiC). The atomic ratio x of Ti is preferably in the range of 0.15-0.25.

According to the method of the present invention, the growth of a bulk silicon carbide single crystal can be carried out either by the above-described cooling method or by the temperature gradient method. Among the raw material components, carbon is preferably supplied to a melt by dissolution of a carbonaceous crucible such as a graphite crucible which contains the melt in order to insure that no undissolved carbon is present in the resulting molten solution. However, as long as a molten solution which is free from undissolved carbon can be formed, part or all of the carbon component may be added to the crucible along with the other components of the raw materials (Si and M). The following description is mainly directed to an embodiment in which C is supplied by dissolution of a graphite crucible.

In the cooling method, Si, Ti or Mn, and optionally C used as raw materials are added to a graphite crucible at a predetermined ratio and heated to a temperature which is equal to or higher than the liquidus temperature of the composition of the raw materials to form a melt. After the melt is formed, isothermal heating, which is heating at a constant temperature, is continued until the carbon concentration of the melt (which is a molten silicon carbide solution) reaches or approaches the saturation point by dissolution of carbon from the graphite crucible. When carbon is added to the crucible as a raw material, heating is continued until the added carbon completely dissolves in the melt.

Whether the additional element M is Mn or Ti, the temperature of the melt is preferably above 1650° C. and below 2000° C. and more preferably in the range of 1650-1850° C.

If the temperature is higher than 1850° C. and particularly higher than 2000° C., evaporation of the melt becomes significant, thereby interfering with the stable growth of a silicon carbide crystal. If the temperature of the melt is lower than 1650° C., the amount of carbon dissolved in the melt decreases, thereby decreasing the production efficiency of a silicon carbide single crystal. In addition, in the case where M is Ti, the temperature is close to the solidus temperature of the composition, so the stability of growth of the single crystal is decreased.

In the resulting alloy melt or molten solution comprising Si, M (M=Mn or Ti), and C, a seed substrate made of an SiC single crystal having the same crystal form (polytype) as a single crystal which is to be produced (e.g., 6H polytype) is immersed. The seed substrate may be immersed in the melt at any point of time during the heating.

Subsequently, the alloy melt is slowly cooled at a constant rate to create a supercooled state in which the temperature of the melt is lower than the liquidus temperature but higher than the solidus temperature, thereby causing the melt (molten solution) to be supersaturated with SiC. Under such conditions, epitaxial growth of an SiC crystal occurs on the seed substrate, resulting in the formation of a silicon carbide single crystal having the same crystal form as the seed substrate. The cooling rate in this stage is an important factor which determines the growth rate of the crystal.

FIG. 1 shows the relationship between the cooling rate of a melt and the growth rate of a silicon carbide single crystal on a seed substrate during cooling after isothermal heating of an Si—Ti melt ($Si_{0.8}Ti_{0.2}$) at 1850° C. or an Si—Mn melt ($Si_{0.4}Mn_{0.6}$) at 1650° C. in a graphite crucible to dissolve carbon from the crucible until the concentration of carbon in the resulting molten solution reaches its saturated concentration. As can be seen from this figure, a cooling rate of lower than 1° C./min results in a decrease in the growth rate of a silicon carbide crystal. On the other hand, if the cooling rate is higher than 6° C./min, crystal growth of silicon carbide by spontaneous precipitation takes place, and due to such crystal growth occurring in the vicinity of the seed substrate, the silicon carbide crystal grown on the substrate tends to become polycrystalline. Therefore, the cooling rate is preferably in the range of 1-6° C./min and more preferably in the range of 2-5° C./min.

When the cooling is finished, the driving force for crystallizing silicon carbide is lost. In the case in which the silicon carbide single crystal grown on the seed substrate is sufficiently large, the substrate is pulled up from the melt, and the melt can subsequently be used for growth of a new crystal after adjustment of the composition, if necessary, or it may be cooled to a temperature lower than the solidus temperature to solidify the entire melt.

However, a single run of such a crystal growth is usually insufficient to obtain a bulk silicon carbide single crystal having an adequate size. In such a case, while the seed substrate remains immersed in the alloy melt or after it is pulled up from the melt, the melt is again heated at the isothermal heating temperature, which is performed prior to cooling, to dissolve carbon from the graphite crucible into the melt (and/or carbon is added and completely dissolved in the melt), and cooling of the melt or immersion of the substrate and cooling of the melt are then performed. By repeating heating and cooling in this manner, the thickness of the silicon carbide single crystal grown on the substrate can be increased. It is possible to produce even an ingot-like bulk single crystal in which the dimension of its thickness is larger than that of its diameter on the substrate by repeating the isothermal heating and cooling many times. In such a case, the seed substrate may be gradually moved upwards, if necessary, depending on the increased thickness of the grown crystal.

In the temperature gradient method, a temperature gradient is formed in a melt of an alloy of Si, M (M=Mn or Ti), and C (i.e., a molten SiC solution) in a crucible, and a silicon carbide single crystal is grown on a seed substrate immersed in a lower temperature region of the temperature gradient formed in the melt. A temperature gradient of the melt is usually formed along the height of the melt, but it may be a gradient in a horizontal direction. The temperature gradient can be formed by controlling the heating device located around the crucible optionally in combination with use of a cooling device located around the crucible at a position of the lower temperature region of the temperature gradient. In the case of a vertical temperature gradient, it is preferable that the temperature of the melt decrease in an upward direction so that the upper part of the melt constitutes the lower temperature region, since the seed substrate is prevented from being exposed to a higher temperature region.

The temperature of the growth interface (the temperature in the vicinity of the substrate positioned in the lower temperature region of the melt) in the temperature gradient method is preferably in the range of 1650-2000 ° C. and more preferably in the range of 1650-1850 ° C. in the case of M=Ti. On the other hand, in the case of M=Mn, due to a lower liquidus temperature of the melt, the temperature of the growth interface is preferably in the range of 1450-2000 ° C. and more preferably in the range of 1650-1850° C. With respect to the temperature of the higher temperature region in the melt, the greater is its difference from the temperature of the growth interface, the faster is the crystal growth due to an increased carbon solubility in the melt (molten solution). In view of the controllability of temperature difference, it is preferable to set the temperature of the higher temperature region at several to several hundred degrees Celsius (° C.) higher than the temperature of the growth interface. If the temperature of the higher temperature region is significantly higher than 2000 ° C., stable crystal growth is impeded for reasons including evaporation of the melt. Therefore, when the temperature of the growth interface is close to 2000° C., it is preferred that the temperature gradient be small so that the temperature of the higher temperature region does not greatly exceed 2000° C.

The temperature gradient formed is preferably in the range of 5-100° C./cm. If it is less than 5° C./cm, the driving force for diffusing silicon carbide, which is the solute in the molten solution, is so weak that the growth rate of a silicon carbide crystal becomes low. If the temperature gradient is greater than 100° C./cm, spontaneous precipitation of silicon carbide takes place in the vicinity of the seed substrate, and the silicon carbide crystal grown on the substrate tends to become polycrystalline. The temperature gradient is more preferably in the range of 5-50° C./cm.

When carbon is supplied by dissolution of a carbonaceous crucible such as a graphite crucible, as in the cooling method, heating of the melt formed in the crucible is continued until the concentration of carbon in the melt reaches or approaches its saturated concentration at least in the higher temperature region of the gradient. Thereafter or in the course of the heating, a seed substrate is immersed in the lower temperature region of the melt formed in the crucible. Because the amount of carbon dissolved in the melt (forming a molten solution) depends on the temperature of the melt, the temperature gradient causes the formation of a gradient in the concentration of carbon in the melt. This difference in the carbon concentration serves as a driving force to diffuse carbon from the higher temperature region to the lower temperature region in the melt. The carbon transported toward the lower temperature region by this diffusion causes the molten solution in the lower temperature region to be in supercooled conditions in which the temperature is lower than the liquidus temperature and thus to be in supersaturated state near the SiC seed substrate, which is immersed in the lower temperature region, resulting in crystallization of silicon carbide on the seed substrate and leading to growth of a silicon carbide single crystal.

When part or all of the carbon component is added to the crucible, the saturated concentration of carbon which is dissolved in the resulting melt or molten solution depends on the temperature. Therefore, a temperature gradient results in the formation of a gradient in the concentration of carbon in the melt, and the same result as above is obtained. In such a case, a seed substrate is immersed in the lower temperature region of the temperature gradient in the melt (molten solution) after the added carbon is completely dissolved.

The crucible used to contain the alloy melt can be made of any refractory material which does not cause leakage of the melt due to deterioration of the crucible by a reaction with the melt and which does not contaminate the melt. When the carbon component is supplied by dissolution from the crucible, a carbonaceous crucible and in particular a graphite crucible is used. When there is no need to dissolve carbon from the crucible (the entire carbon component is added), a crucible made of graphite or other refractory material and lined with pure silicon carbide can be used.

In order to prevent oxidation of the melt, it is preferable to enclose the crystal growth apparatus which is used and which includes the crucible and a heating device therefor in a sealed space and establish a non-oxidizing atmosphere (e.g., a rare gas atmosphere) in the sealed space.

It is also possible to produce a bulk single crystal of a doped silicon carbide. For example, silicon carbide serves as a p-type semiconductor when doped with Al or B or an n-type semiconductor when doped with N or P. The dopant may be added to the crucible, or when it is N, it may be introduced from atmospheric gas.

A silicon carbide single crystal produced according to the present invention includes much fewer structural defects compared to a single crystal produced by the PVT technique, since the formation of polytypes does not occur. Furthermore, in accordance with the method of the present invention, it is possible to produce a silicon carbide single crystal at a temperature of not higher than 2000° C., which is desirable from the standpoint of commercial operation, and at a growth rate which is high enough for practical application. Thus, the present invention makes it possible to produce a bulk silicon carbide single crystal which is free from micropipe defects. Such a bulk silicon carbide single crystal is suitable for use as a substrate for an optical or electronic device.

Best Mode for Carrying Out the Invention

EXAMPLE 1

Figure 2:
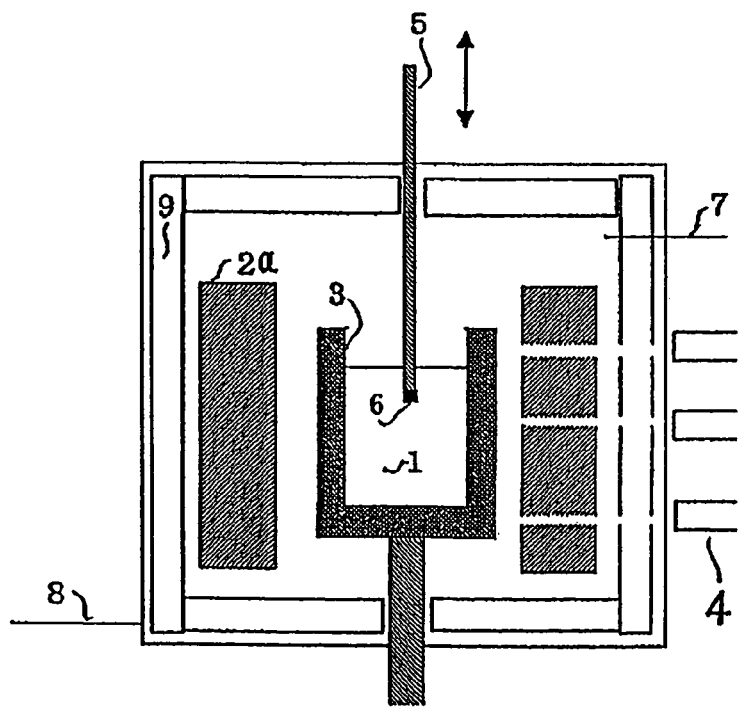
FIG. 2 is a schematic cross-sectional view showing an example of a crystal growth apparatus which can be used to produce a silicon carbide single crystal by the cooling method.

This example illustrates the production of a bulk silicon carbide single crystal by the cooling method using a crystal growth apparatus as shown in FIG. 2.

The crystal growth apparatus shown in FIG. 2 comprises a graphite crucible 3 containing an alloy melt 1, and the crucible 2 is encircled with a resistance heater 2a made of highly purified graphite. The resistance heater 2a and the graphite crucible 3 are enclosed within a thermal insulator 9. The temperature of the side wall of the graphite crucible 3 is directly measured by a plurality of optical pyrometers 4 through sight holes formed in the heater 2a and the thermal insulator 9. The heater 2a is controlled by the temperatures measured by these pyrometers 4 such that the crucible 3 is heated almost isothermally at a predetermined temperature. The atmosphere in the crystal growth apparatus is adjusted to an Ar atmosphere using a gas inlet 7 and a gas outlet 8.

The graphite crucible 3 was charged with raw materials (Si and Ti) sufficient to make an alloy having a composition of $Si_{0.8}Ti_{0.2}$ and heated to 1850° C. at atmospheric pressure in an Ar atmosphere to allow the raw materials to melt. The resulting melt was kept at a temperature of 1850° C. for 5 hours so that carbon was dissolved from the inner wall of the graphite crucible 3 into the melt to reach its saturation level and form a molten solution. Thereafter, a seed substrate 6 made of a single crystal of 6H-SiC secured to a graphite holding jig 5 was immersed in the melt (molten solution) 1. The graphite crucible 3 and the holding jig 5 were both rotated in reverse directions to each other. One hour after immersion of the substrate 6, cooling was started at a rate of 0.5° C./min by controlling the heater 2a and was continued until the temperature of the entire melt 1 reached 1650° C. (over 400 minutes of cooling time). Subsequently, the holding jig 5 was moved upwards to draw up and recover the substrate 6 from the melt 1, and the crucible was then allowed to cool to room temperature.

The thickness (µm) of the bulk silicon carbide single crystal grown on the substrate was measured, and it was divided by the cooling time (hr) to calculate the crystal growth rate (µm/hr).

In addition, the bulk silicon carbide single crystal was cut and polished so as to expose the {0001} plane, and after the crystal was treated for 10 minutes in molten KOH (at 450-500° C.) and washed thoroughly with water, the plane was observed under an optical microscope to count the number of hexagonal etching pits of 2 µm or larger in size, which are peculiar to micropipe defects. The micropipe defects were evaluated in the following manner:

⊚: the micropipes found in the seed crystal were filled and no micropipe defects were observed;

○: some micropipes found in the seed crystal were filled, but remaining micropipe defects were observed;

X: as many micropipes were observed as found in the seed crystal.

EXAMPLE 2

A bulk silicon carbide single crystal was grown on a seed substrate 6 by the cooling method in the same manner as in Example 1 except that the graphite crucible 3 was charged with raw alloy materials having a composition of $Si_{0.4}Mn_{0.6}$ and heated at 1650° C. to melt the raw materials and that cooling was carried out from that temperature to 1450° C.

EXAMPLE 3

A bulk silicon carbide single crystal was grown on a seed substrate 6 by the cooling method in the same manner as in Example 2 except that the cooling rate was increased to 2° C./min.

EXAMPLE 4

Figure 3:
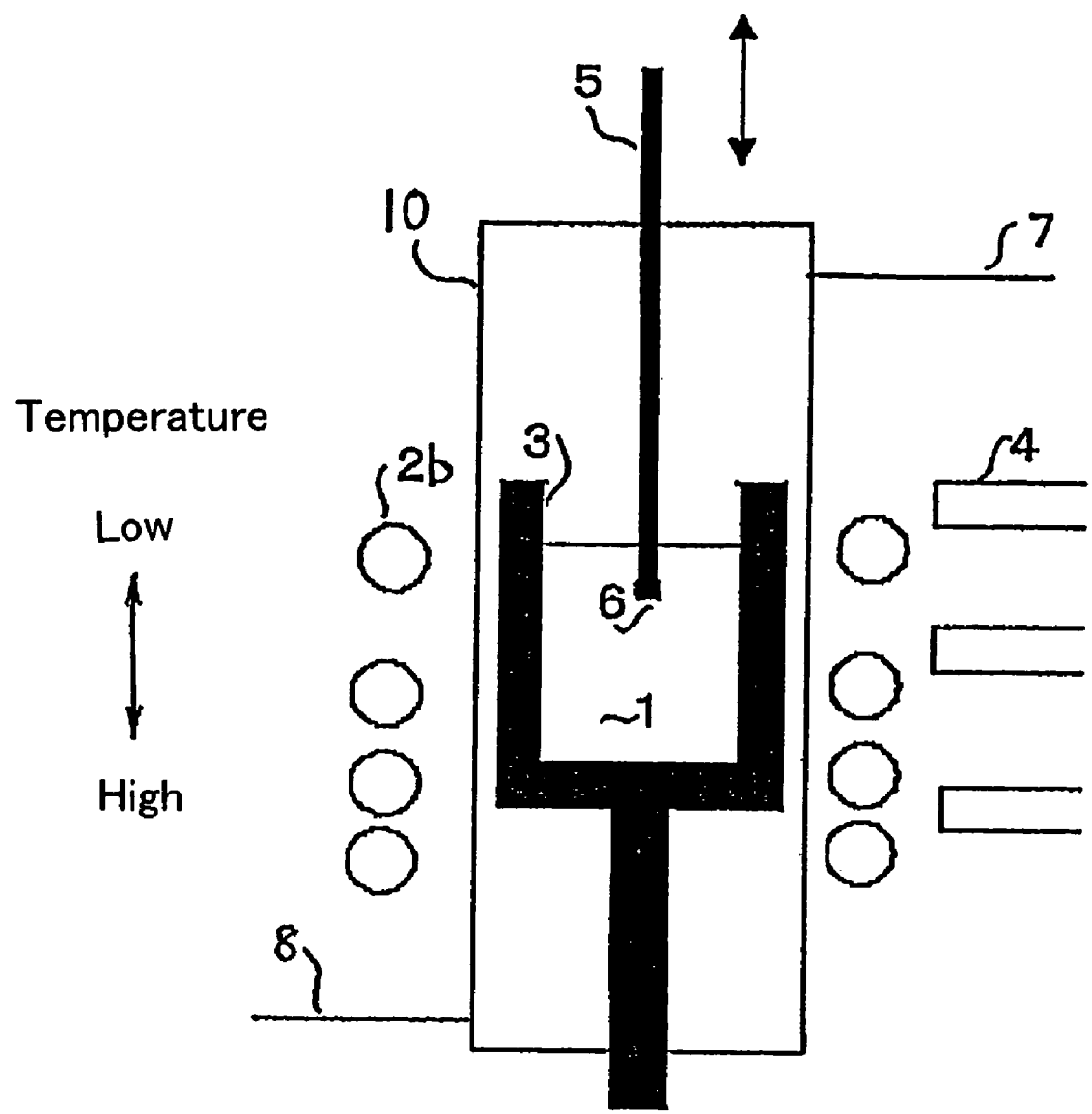
FIG. 3 is a schematic cross-sectional view showing an example of a crystal growth apparatus which can be used to produce a silicon carbide single crystal by the temperature gradient method.

This example illustrates the production of a bulk silicon carbide single crystal by the temperature gradient method using a crystal growth apparatus as shown in FIG. 3.

The crystal growth apparatus shown in FIG. 3 comprises a graphite crucible 3 containing an alloy melt 1, and the crucible 2 is placed in a reactor tube 10 made of quartz glass. The reactor tube is surrounded by a high-frequency induction heating coil 2b to heat the graphite crucible 3 by induction heating. Also in the apparatus shown in FIG. 3, the temperature of the side wall of the crucible 3 is directly measured by a plurality of optical pyrometers 4. The high-frequency induction heating is controlled by the measured values of temperature of the side wall of the crucible 3. A temperature difference is formed along the height of the crucible 3 depending on the positional relationship between the crucible 3 and the high-frequency induction heating coil 2b. The temperature gradient which is formed can be adjusted by varying the number of turns of the coil 2b and distance of adjacent turns thereof. In order to obtain an increased temperature gradient, it is effective to apply forced cooling to the lower temperature region of the crucible 3 using a water cooling jig.

In this example, the upper part of the graphite crucible 3 formed the lower temperature region. The temperature of the melt 1 in the vicinity of a seed substrate 6 which was immersed in the lower temperature region was determined by measuring the temperature of the side wall of the crucible 3 by a pyrometer 4 located at the level where the substrate was positioned. The temperature gradient was calculated from the difference in the temperature of the side wall of the crucible between the level where the substrate 6 was positioned and the level where the temperature was highest and from the distance between these two levels.

The graphite crucible 3 was charged with raw materials (Si and Ti) sufficient to make an alloy having a composition of $Si_{0.8}Ti_{0.2}$ and heated at atmospheric pressure in an Ar atmosphere such that the temperature of the side wall of the crucible at the level of the position in which the seed substrate 6 was to be immersed in the upper part of the resulting melt (i.e., the temperature at the growth interface) was 1650° C. to allow the alloy materials to melt. A temperature gradient in which the temperature increased at a rate of 5° C./cm from the level where the substrate 6 was to be positioned toward the bottom part of the crucible 3 which was the higher temperature region was established by adjusting the number of turns of the coil 2b and the distance between adjacent turns thereof. The highest temperature at the bottom part of the crucible was about 1660° C.

The alloy melt formed in the graphite crucible 3 was heated for 5 hours while the above-described temperature gradient was maintained so that carbon was dissolved from the inner wall of the crucible into the melt to reach its saturation level and form a molten solution. Thereafter, a seed substrate 6 made of a single crystal of 6H-SiC secured to a graphite holding jig 5 was immersed in the lower temperature region located in the upper part of the melt or molten solution (at the level of the position where the temperature of the side wall of the crucible was 1650° C.). The graphite crucible 3 and the holding jig 5 which held the seed single crystal were both rotated in reverse directions to each other. 20 hours after immersion of the seed substrate 6, the holding jig 5 was moved upwards to draw up and recover the substrate 6 from the melt 1, and the melt was then allowed to cool to room temperature.

The thickness (μm) of the bulk silicon carbide single crystal grown on the substrate was measured, and it was divided by the growing (immersion) time (=20 hours) to calculate the crystal growth rate (μm/hr). In addition, the bulk silicon carbide single crystal was evaluated with respect to micropipe defects in the same manner as in Example 1.

EXAMPLE 5

A bulk silicon carbide single crystal was grown on a seed substrate 6 by the temperature gradient method in the same manner as in Example 4 except the graphite crucible 3 was charged with raw alloy materials having a composition of $Si_{0.4}Mn_{0.6}$.

EXAMPLE 6

A bulk silicon carbide single crystal was grown on a seed substrate 6 by the temperature gradient method in the same manner as in Example 5 except that the temperature gradient was increased to 20° C./cm by elevating the heating temperature in the higher temperature region.

COMPARATIVE EXAMPLE 1

A bulk silicon carbide single crystal was grown on a seed substrate 6 by the cooling method in the same manner as in Example 1 except that the graphite crucible 3 was charged with raw alloy materials having a composition of $Si_{0.95}Ti_{0.05}$.

COMPARATIVE EXAMPLE 2

A bulk silicon carbide single crystal was grown on a seed substrate 6 by the cooling method in the same manner as in Example 2 except that the graphite crucible 3 was charged with raw alloy materials having a composition of $Si_{0.95}Mn_{0.05}$.

COMPARATIVE EXAMPLE 3

A bulk silicon carbide single crystal was grown on a seed substrate 6 by the temperature gradient method in the same manner as in Example 4 except that the graphite crucible 3 was charged with raw alloy materials having a composition of $Si_{0.95}Ti_{0.05}$.

COMPARATIVE EXAMPLE 4

A bulk silicon carbide single crystal was grown on a seed substrate 6 by the temperature gradient method in the same manner as in Example 5 except that the graphite crucible 3 was charged with raw alloy materials having a composition of $Si_{0.95}Mn_{0.05}$.

The conditions of production and the results of measurements of the single crystals grown on a substrate for the foregoing examples and comparative examples are shown in Table 1.

TABLE 1

| | Composition of alloy charged (atomic ratio) | Temp. of melt in the vicinity of substrate (° C.) | Cooling rate (° C./min) | Temperature gradient (° C./cm) | Rate of crystal growth (μm/hr) | Thickness of crystal (μm) | Defects[1] |
|---|---|---|---|---|---|---|---|
| Example 1 | Si:Ti = 80:20 | 1850→1650 | 0.5 | — | 110 | 732 | ◎ |
| Example 2 | Si:Mn = 40:60 | 1650→1450 | 0.5 | — | 250 | 1665 | ◎ |
| Example 3 | Si:Mn = 40:60 | 1650→1450 | 2 | — | 1000 | 1660 | ◎ |

TABLE 1-continued

|  | Composition of alloy charged (atomic ratio) | Temp. of melt in the vicinity of substrate (° C.) | Cooling rate (° C./min) | Temperature gradient (° C./cm) | Rate of crystal growth (μm/hr) | Thickness of crystal (μm) | Defects[1] |
|---|---|---|---|---|---|---|---|
| Example 4 | Si:Ti = 80:20 | 1650 | — | 5 | 105 | 2100 | ◎ |
| Example 5 | Si:Mn = 40:60 | 1650 | — | 5 | 280 | 5600 | ◎ |
| Example 6 | Si:Mn = 40:60 | 1650 | — | 20 | 560 | 11200 | ◎ |
| Comp. Ex. 1 | Si:Ti = 95:5 | 1850→1650 | 0.5 | — | 15 | 100 | ○ |
| Comp. Ex. 2 | Si:Mn = 95:5 | 1650→1450 | 0.5 | — | 35 | 233 | ○ |
| Comp. Ex. 3 | Si:Ti = 95:5 | 1650 | — | 5 | 35 | 700 | ◎ |
| Comp. Ex. 4 | Si:Mn = 95:5 | 1650 | — | 5 | 55 | 1100 | ◎ |

[1]Defects: Micropipe defects

It can be seen from Table 1 that a method according to the present invention can produces a bulk silicon carbide single crystal which is free from micropipe defects at a satisfactory growth rate from a practical viewpoint at a temperature of the melt which is lower than 2000° C. by either the cooling method or the temperature gradient method. As the cooling rate or the temperature gradient increases, the growth rate of a silicon carbide single crystal increases. It is considered from this result that diffusion of carbon dissolved in the alloy melt to reach the surface of the substrate would be the rate-determining stage for crystal growth of silicon carbide.

In Examples 1-3 (by the cooling method), since the crystal growth step by cooling was performed just once, the resulting crystals had a thickness which was smaller than that obtained in Examples 4-6 (by the temperature gradient method) in which the duration of crystal growth was longer. It should be understood that even in Examples 1-3, the crystals can be made to have an increased thickness by repeating the heating and cooling steps.

All the silicon carbide single crystals obtained in Examples 1-6 and Comparative Example 1-4 had the crystal form of 6H-SiC which was the same as that of the substrate when examined by Raman spectroscopy and electron diffraction.

The invention claimed is:

1. A method of producing a silicon carbide single crystal comprising the steps of: immersing a seed substrate of silicon carbide in a melt of an alloy comprising Si, C, and M (wherein M is either Mn or Ti) and having an atomic ratio between Si and M in which the value of x, when expressed as $Si_{1-x}M_x$, is $0.1 \leq x \leq 0.7$ in the case where M is Mn or $0.1 \leq x \leq 0.25$ in the case where M is Ti, the melt being free from undissolved C; and allowing a silicon carbide single crystal to grow on the seed substrate by supercooling of the alloy melt as a molten solution at least in the vicinity of the seed substrate so as to create a state which is supersaturated with SiC.

2. A method as claimed in claim 1 wherein the supercooling of the alloy melt is achieved by cooling the alloy melt.

3. A method as claimed in claim 2 wherein the alloy melt has a temperature which is in the range of at least 1650° C. and at most 2000° C. when the substrate is immersed therein and wherein the cooling is performed at rate of 1-6° C./min.

4. A method as claimed in claim 2 wherein the growth of the silicon carbide single crystal on the substrate is continued by terminating the cooling of the alloy melt at a temperature which is higher than the solidus temperature of the alloy and subsequently performing supercooling repeatedly by repeated heating and cooling of the melt.

5. A method as claimed in claim 1 wherein the supercooling of the alloy melt is achieved by forming a temperature gradient in the alloy melt.

6. A method as claimed in claim 5 wherein the temperature gradient of the alloy melt is in the range of 5-100° C./cm and wherein the temperature of the alloy melt in the vicinity of the substrate is at least 1450° C. and at most 2000° C.

7. A method as claimed in claim 3 wherein the temperature is in the range of 1650-1850° C.

8. A method as claimed in claim 1 wherein the C in the alloy melt is supplied by dissolution of a carbonaceous crucible which contains the alloy melt.

9. A method as claimed in claim 6 where in the temperature is in the range of 1650-1850° C.

10. A method as claimed in claim 2 wherein the C in the alloy melt is supplied by dissolution of a carbonaceous crucible which contains the alloy melt.

11. A method as claimed in claim 3 wherein the C in the alloy melt is supplied by dissolution of a carbonaceous crucible which contains the alloy melt.

12. A method as claimed in claim 4 wherein the C in the alloy melt is supplied by dissolution of a carbonaceous crucible which contains the alloy melt.

13. A method as claimed in claim 5 wherein the C in the alloy melt is supplied by dissolution of a carbonaceous crucible which contains the alloy melt.

14. A method as claimed in claim 6 wherein the C in the alloy melt is supplied by dissolution of a carbonaceous crucible which contains the alloy melt.

15. A method as claimed in claim 7 wherein the C in the alloy melt is supplied by dissolution of a carbonaceous crucible which contains the alloy melt.

* * * * *

UNITED STATES PATENT AND TRADEMARK OFFICE
CERTIFICATE OF CORRECTION

PATENT NO.        : 7,520,930 B2                                       Page 1 of 1
APPLICATION NO.   : 10/967070
DATED             : April 21, 2009
INVENTOR(S)       : Kusunoki et al.

It is certified that error appears in the above-identified patent and that said Letters Patent is hereby corrected as shown below:

Column 13, Line 45 Claim 1, "$0.1 \leq x\ 0.25$" should read -- $0.1 \leq x \leq 0.25$ --

Column 14, Line 35, Claim 9, "where in the" should read -- wherein the --

Signed and Sealed this

Fourteenth Day of July, 2009

JOHN DOLL
*Acting Director of the United States Patent and Trademark Office*